United States Patent [19]
Lin et al.

[11] Patent Number: 5,356,822
[45] Date of Patent: Oct. 18, 1994

[54] METHOD FOR MAKING ALL COMPLEMENTARY BICDMOS DEVICES

[75] Inventors: John Lin, Ellicott City; Andras F. Cserhati, Columbia, both of Md.

[73] Assignee: AlliedSignal Inc., Morris Township, Morris County, N.J.

[21] Appl. No.: 184,516

[22] Filed: Jan. 21, 1994

[51] Int. Cl.[5] ............................................. H01L 21/265
[52] U.S. Cl. ....................... 437/34; 437/59; 437/57; 437/62; 148/DIG. 9
[58] Field of Search ......... 437/59, 34, 57, 56, 437/62, 51

[56] References Cited

U.S. PATENT DOCUMENTS

| | | | |
|---|---|---|---|
| 3,953,255 | 4/1976 | Combs, Jr. ................. | 437/59 |
| 4,887,142 | 12/1989 | Bertotti et al. ............. | 257/338 |
| 5,006,479 | 4/1991 | Brandwie ................... | 437/27 |
| 5,258,318 | 11/1993 | Butti et al. ............. | 148/DIG. 9 |
| 5,273,915 | 12/1993 | Hwang et al. ............. | 437/59 |
| 5,296,409 | 3/1994 | Merrill et al. ............. | 437/59 |

Primary Examiner—Brian E. Hearn
Assistant Examiner—Tuan Nguyen
Attorney, Agent, or Firm—Howard G. Massung

[57] ABSTRACT

A method for making all complementary BiCDMOS devices on a SOI substrate (10). Isolated n$^-$ and p$^-$ regions (20,32,34,36,40,42) are formed on the silicon layer (16) and oxidized. LOCOS oxide regions (28) are formed on selected pairs of the n$^-$ and p$^-$ regions on which gates (44) for complementary DMOS device (114,116) and field plates (46) for complementary bipolar devices (118,120) are formed. Gates (48) for complementary MOS devices (122,124) are formed directly on the oxidized silicon layer (24). N-type and p-type dopants are then implanted into the silicon layer (16) forming n body and p body areas (54,56,58,60). Selected n$^+$ and p$^+$ areas (66,68) are formed in the n body and p body areas (54,56,58,60) as well as selected areas of n$^-$ and p$^-$ regions (30,32,34,36,40,42). The substrate (10) is then covered with an oxide layer and windows etched therethrough to expose said n$^+$ and p$^+$ areas (66,68) and selected areas of the gates (44,48) and field plates (46). Metal electrical contacts (78-112) are deposited through the windows to the n$^+$ and p$^+$ $^{areas}$ (66,68) and the gates (44,48) and field plates (46).

14 Claims, 4 Drawing Sheets

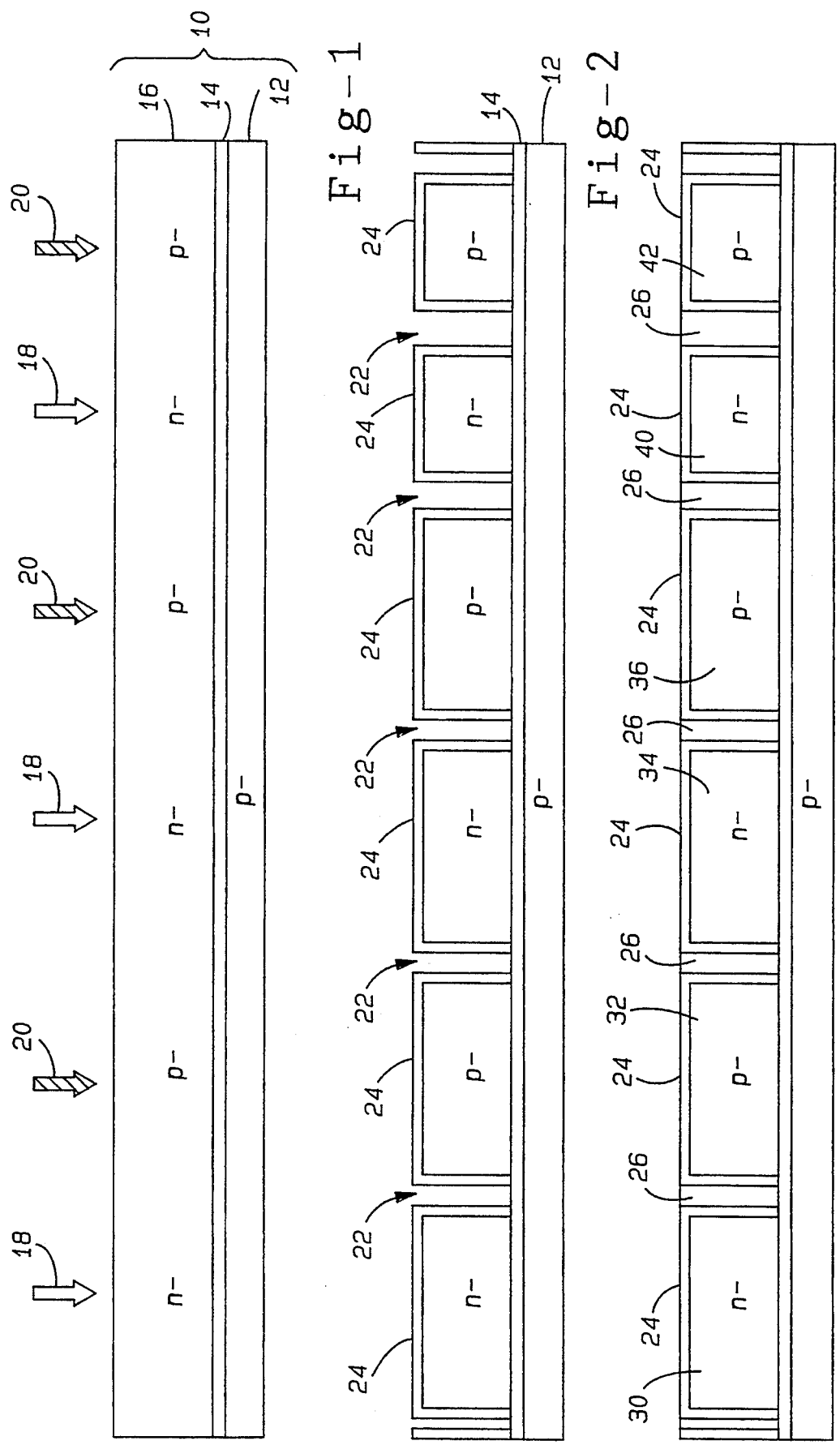

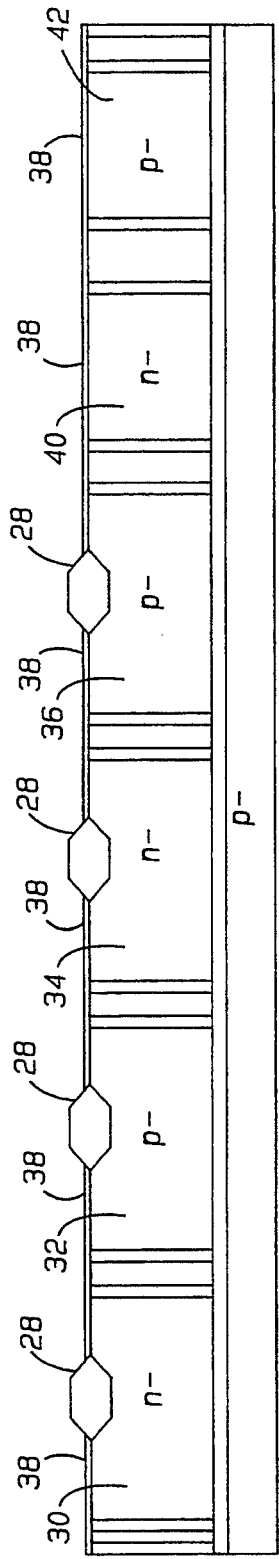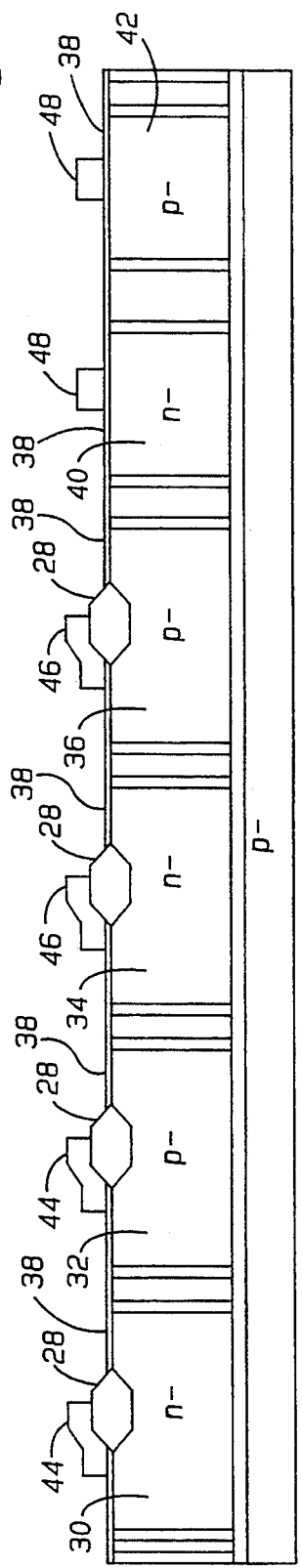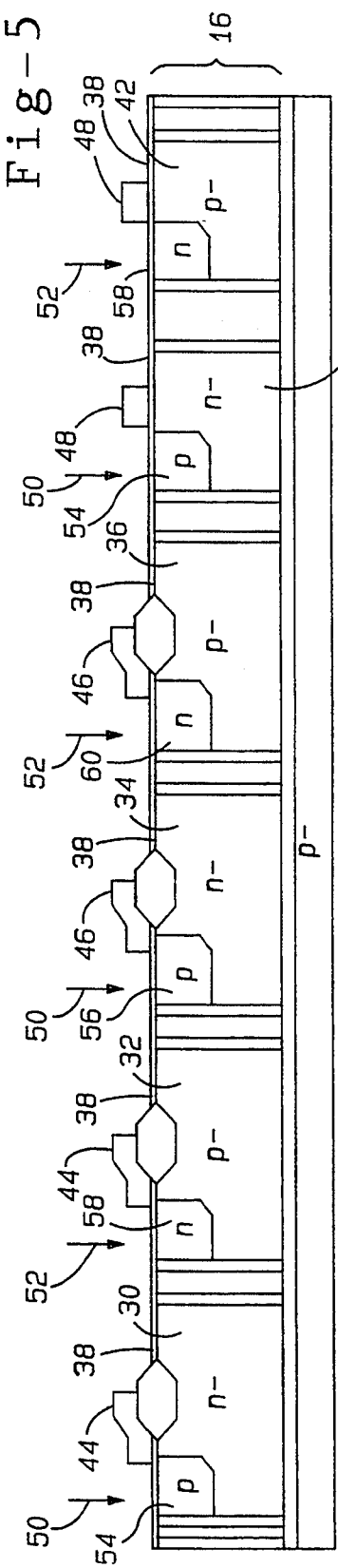

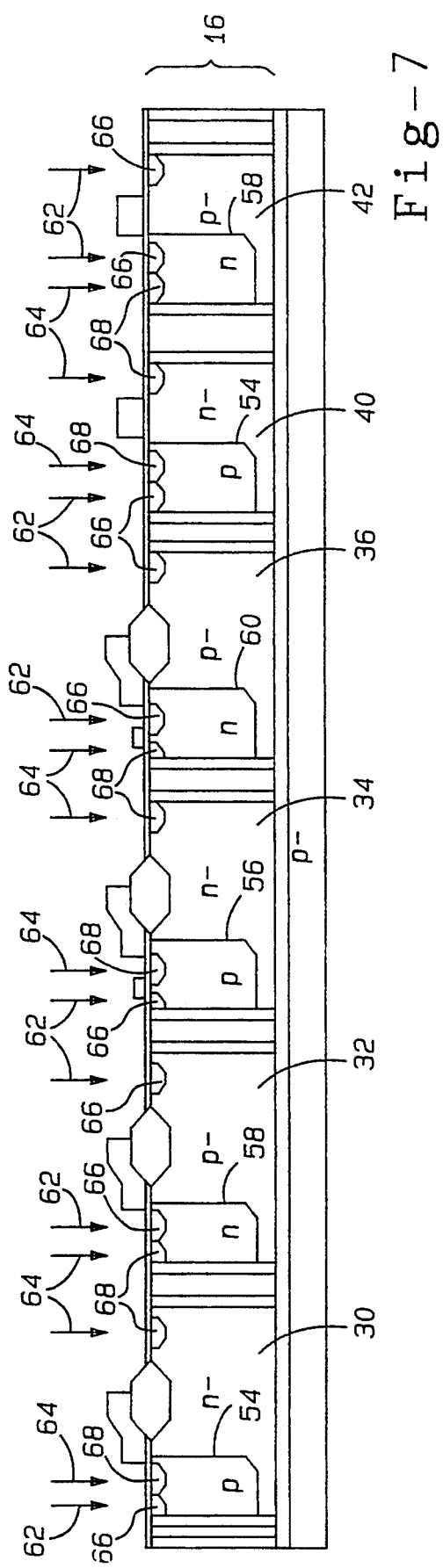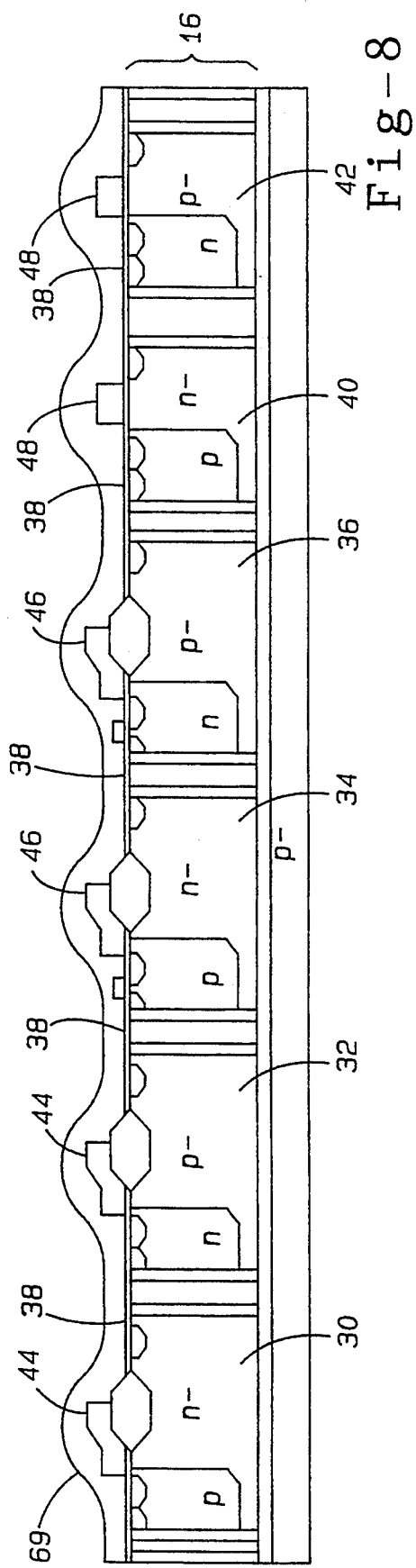

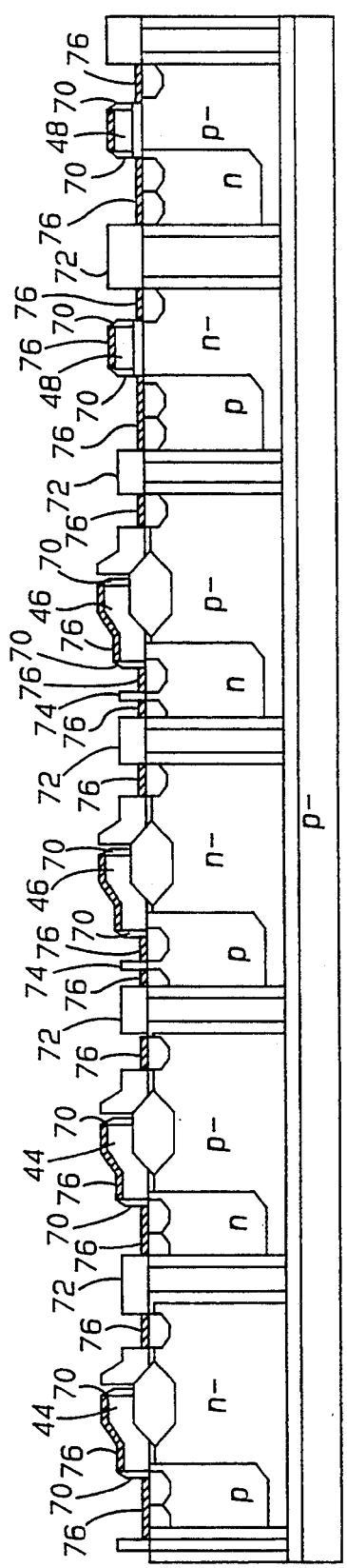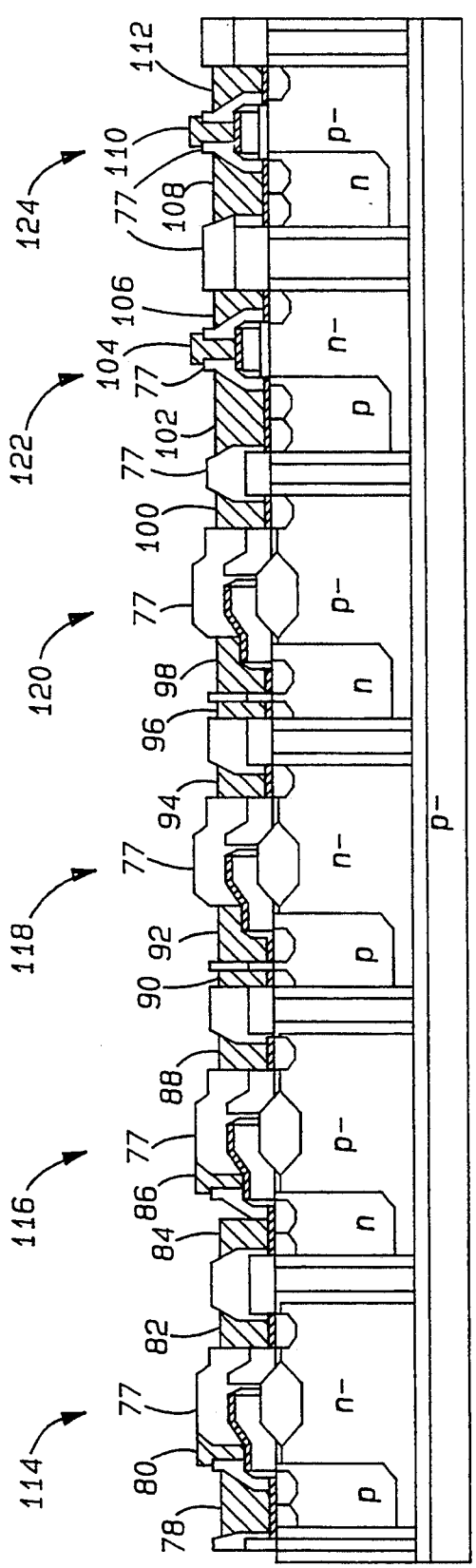

5,356,822

METHOD FOR MAKING ALL COMPLEMENTARY BICDMOS DEVICES

TECHNICAL FIELD

The invention is related to the field of making complementary transistors and, in particular, to a method for making Bipolar, Complementary Metal-On-Silicon (MOS), and Double-diffused Metal-On-Silicon (DMOS) transistors on silicon-on-insulator (SOI) Substrates.

BACKGROUND ART

Various methods for making complementary transistors on SOI substrates are known in the art. Foerstner et al., in U.S. Pat. No. 5,164,326 and Usui et al., in U.S. Pat. No. 5,162,254 teach methods for making complementary bipolar and CMOS transistors on SOI substrates. Eklund and Eklund et al., in U.S. Pat. Nos. 5,049,513 and 5,102,809, respectively, teach a fabrication process for making BICMOS devices on a SOI substrate, while Lee et al., in U.S. Pat. No. 4,910,165 teaches a method for forming epitaxial silicon-on-insulator structures using oxidized porous silicon and discloses use of this epitaxial silicon for MOS, CMOS or bipolar transistors.

To date, the prior art has taught processes for making integrated circuits having bipolar and CMOS transistors on SOI substrates. The ability to make complementary bipolar, complementary MOS and complementary DMOS transistors would enable smart power applications where power devices, control logic and analog functions on a single integrated circuit is desirable. The full complement of complementary devices on a single integrated circuit leads to versatile and simplified circuits.

DISCLOSURE OF INVENTION

The invention is a method for making complementary DMOS, bipolar and MOS transistors on the silicon layer of a silicon-on-insulator (SOI) substrate. The method comprises the steps of implanting an n-type dopant and a p-type dopant into the silicon layer to form a plurality of $n^-$ and $p^-$ regions. The silicon layer is then etched to electrically isolate the $n^-$ and $p^-$ regions from each other. The surface of the silicon layer is then oxidized to form an oxide layer and local oxidized regions are grown on selected pairs of the $n^-$ and $p^-$ regions, each selected pair comprising one region and one $p^-$ region.

Gates for the complementary DMOS transistors are then formed over the channel regions and extend over the local oxidized regions. Field plates for bipolar transistors are formed on the local oxidized regions of a second pair of $n^-$ and $p^-$ regions and extend over the oxide layer covering the base regions of the bipolar transistors.

Gates for the MOS transistors are formed on the oxide layer of a third pair of $n^-$ and $p^-$ regions.

A p-type dopant is implanted into the $n^-$ regions to form p body areas adjacent to the gates and the field plates while an n-type dopant is implanted into the $p^-$ regions to form n body areas adjacent to the gates and the field plates. This is followed by implanting n-type dopants and p-type dopants into selected areas of the n body and p body areas and selected areas of the $n^-$ regions and $p^-$ regions to form $n^+$ and $p^+$ areas. A low temperature oxide layer is then grown over the entire surface of the SOI substrate and windows are etched through the low temperature oxide layer exposing the gates, and the field plates and the $n^+$ and $p^+$ areas of the SOI substrate. A layer of metal is then deposited on the areas of the gates and field plates and the $n^+$ and $p^+$ areas exposed by the windows to provide electrical contacts to the sources, gates and drains of the complementary DMOS and MOS transistors and the electrical contact to the collector, base and emitter of the complementary bipolar transistors.

One advantage of this process is that it produces an integrated device having high performance complementary transistors exhibiting high temperature performance and radiation hardness.

Another advantage of this process is that it offers flexibility for smart power integrated circuits.

These and other advantages will become more apparent from a reading of the specification in conjunction with the drawings.

BRIEF DESCRIPTION OF THE DRAWINGS

FIG. 1 shows a cross-section of the SOI substrate and the implantation of the n-type and p-type dopants to form the $n^-$ and $p^-$ regions in the silicon layer;

FIG. 2 shows a cross-section of the structure after etching the trenches and oxidation;

FIG. 3 shows a cross-section of the structure after planarization;

FIG. 4 shows a cross-section of the structure after forming the local oxide areas;

FIG. 5 shows a cross-section of the structure after the formation of the gates and field plates;

FIG. 6 shows a cross-section of the structure resulting from the second implantation of n and p-type dopants;

FIG. 7 shows a cross-section of the structure after the formation of the $n^+$ and $p^+$ areas;

FIG. 8 shows a cross-section of the deposition of an oxide layer over the entire surface of the substrate;

FIG. 9 shows a cross-section of the structure resulting from etching windows in the oxide layer and the deposition of the metal for forming low resistance silicide contacts; and FIG. 10 shows a cross-section of the completed structure of the complementary DMOS transistors, the complementary bipolar transistors, and the complementary MOS transistors.

BEST MODE FOR CARRYING OUT THE INVENTION

The process for the fabrication of complementary bipolar, complementary MOS (metal-on-silicon), and complementary DMOS (double diffused source MOS) transistors on an SOI (silicon-on-insulator) substrate will be discussed relative to the structures shown in FIGS. 1 through 10. Referring first to FIG. 1, the starting SOI substrate 10 comprises a handle wafer 12, such as a lightly-doped silicon wafer having an insulating layer 14 formed on its top surface. The insulating layer 14 is preferably a silicon oxide layer grown on the handle layer 12 by thermal oxidation or any other method known in the art.

A silicon layer 16 is provided on the top surface of the insulating layer 14 forming the desired SOI structure. The silicon layer 16 is a seed wafer directly bonded to the handle wafer. The seed wafer is then ground and polished to the desired thickness. The thickness of the insulating layer 14 and the silicon layer 16 are preferably in the 1 to 3 micron range.

The fabrication process begins by implanting an n-type dopant, such as phosphorous, into the silicon layer 16 using a first mask to form n− regions in the silicon layer 16. The arrows 18 shown in FIG. 1 symbolically represent the implanting of the n-type dopant. The n− regions are the basic building blocks of nDMOS, npn, and nMOS transistors. In a like manner, a p-type dopant, such as boron, is implanted into the silicon layer 16 using a second mask to form p− regions. The arrows 20 symbolically represent the implanting of the p-type dopant. The p− regions are the basic building blocks of the pDMOS, pnp, and pMOS transistors. Although the n− and p− regions are shown to be interleaved in FIG. 1, this interleaved arrangement is only for illustrative purposes and the n− and p− regions may be arranged in any other convenient pattern. The masks used in the fabrication process are not shown to simplify the drawing, however, their configurations or patterns would be obvious to those skilled in the art from the resulting structures. Further, the thickness of the layers are exaggerated for illustrative purposes.

The quantities of the n-type and p-type dopants implanted in the silicon layer 16 set the doping of the drain extensions, collector extensions and the lightly doped drain (LLD) regions of the DMOS, bipolar and complementary MOS (CMOS) transistors respectively.

Referring now to FIG. 2, trenches 22 are etched through the silicon layer 16 using a third mask. After the etching of the trenches 22, a layer of thermal oxide 24 is grown on the surface of the silicon layer 16 and the side walls of the trenches 22 as shown. Planarization of the substrate 10 is subsequently achieved by filling the trenches 22 with polysilicon 26 followed by a blanket etch. As shown in FIG. 3, the blanket etch only removes the polysilicon 26 from the top surface of the silicon layer 16 leaving the trenches 22 filled with polysilicon 26. Using a fourth mask, a LOCOS oxide region 28 is grown in the nDMOS region 30, in the pDMOS region 32, in the npn region 34 and in the pnp region 36 of the silicon layer 16, as shown in FIG. 4. Following the growth of the LOCOS oxide 28, the thermal oxide 24 is blanket-etched away and high-quality thin oxide layer 38 is grown to serve as gate oxide in DMOS and CMOS regions 30, 32, 40 and 42. The LOCOS oxide 28 is used to provide a tapered dielectric layer on which the gate and field plates are to be grown as shall be explained hereinafter.

After the growth of the high quality thin oxide layer 38, a polysilicon layer is deposited over the top surface of the substrate 10 then etched, using a fifth mask. The etching, as shown in FIG. 5, forms the polysilicon gate electrode and field gate 44 of the complementary nDMOS and pDMOS transistors, the polysilicon field plate 46 of the npn and pnp transistors and the polysilicon gate electrode 48 of the complementary nMOS and pMOS transistors. The polysilicon gate electrode of the nDMOS and pDMOS transistors extend from the channel regions over the LOCOS oxide areas and the polysilicon field plate of the npn and pnp transistors extend from the LOCOS oxide areas over the base regions of the npn and pnp transistors and are insulated therefrom by the thin oxide layer 38. This step may also be used to form local interconnects.

A p-type dopant, indicated by arrows 50, is implanted into n− regions of the silicon layer 16 using a sixth mask, as shown in FIG. 6. In a like manner, an n-type dopant, indicated by arrows 52, is implanted into p− regions of the silicon layer 16 using a seventh mask. The substrate is then heated to diffuse the p-type dopant and the n-type dopant into the silicon layer 16 to form p body and p base regions 54 and 56, respectively, and to diffuse the n-type dopants into the silicon layer 16 to form n body and n base regions 58 and 60, respectively, as shown.

The p-type dopant is preferably boron and the n-type dopant is preferably phosphorous. However, the p-type and n-type dopants may be any other p-type and n-type dopants known in the art.

Referring now to FIG. 7, heavy p and n dopants indicated by arrows 62 and 64, respectively, are implanted using an eighth and ninth mask to form p+ and n+ areas in the n body and p body regions and the n− and p− regions as shown. The p+ and n+ areas 66 and 68 minimize the p body and n body series resistances and create the source/drain and body contacts for the MOS and DMOS devices and the emitter/base/collector contacts for the bipolar devices.

The implanting of the n+ and p+ areas is followed by the deposition of a low temperature oxide (LTO) to form an oxide layer 69 as shown in FIG. 8. The oxide layer 69 is then etched using a tenth mask, as shown in FIG. 9, to form side wall spacers 70 on the gate electrodes 44 of the complementary nDMOS and pDMOS transistors, the emitter field plate 46 of the complementary npn and pnp transistors, and the gate electrodes 48 of the complementary nMOS and pMOS devices. The etching removes the oxide layer 38 over the n+ and p+ contact areas and will leave vertical spacers 72 above the trenches 22 and vertical spacers 74 between the p+ and n+ areas of the npn and pnp devices as shown in FIG. 9. A layer of cobalt 76 is deposited on the contact regions of the DMOS, bipolar and MOS devices. The substrate is then heated, as is known in the art, to silicize the contact areas, gates and local interconnects forming low resistance contact areas. The unreacted cobalt on top of the remaining low temperature oxide layer 69 is then etched away.

After silicizing the contact areas, gates and local interconnects, the entire surface of the substrate is coated with a low temperature oxide layer 77 through which contact holes are etched using an eleventh mask, as shown in FIG. 10. This is followed by the deposition and patterning of a metal, such as aluminum, using a final or twelfth mask to form the desired metal contacts and interconnects.

In FIG. 10, the metal contacts 78, 80 and 82 are the source, gate and drain contacts, respectively, of a nDMOS transistor 114 while metal contacts 84, 86 and 88 are the source, gate and drain contacts, respectively, of the complementary pDMOS transistor 116. In a corresponding manner, the metal contacts 90, 92 and 94 are the base, emitter, and collector contacts, respectively, of an npn transistor 118, while metal contacts 96, 98 and 100 are the contacts for the base, emitter and collector, respectively, for the complementary pnp transistor 120. The metal contacts 102, 104 and 106 are the source, gate and drain contacts, respectively, of an nMOS transistor 122 while metal contacts 108, 110 and 112 are the source, gate and drain contacts for a complementary pMOS transistor 124.

As previously discussed, the specific arrangement and the number of complementary DMOS, complementary bipolar and complementary MOS transistors illustrated in FIGS. 1–10 is for illustrative purposes only. It is acknowledged that those skilled in the art may select a different arrangement of the complementary transistors to optimize the interconnects or other features of the finished product.

Further, it is not intended that the processing scheme be limited to the specific steps and materials set forth in the specification. It is recognized that those skilled in the art may make certain changes or improvements within the scope of the invention as set forth in the appended claims.

What is claimed is:

1. A method for making complementary DMOS, bipolar and MOS transistors on a silicon layer of a SOI substrate comprising the steps of:

implanting an n-type dopant and a p-type dopant into selected regions of said silicon layer to form a plurality of n$^-$ and p$^-$ regions;

etching through the silicon layer to electrically isolate said n$^-$ and p$^-$ regions from each other;

oxidizing the surfaces of said n$^-$ and regions to form a first oxide layer;

growing local oxidized regions on selected pairs of said n$^-$ and p$^-$ regions, each of said selected pairs comprising one n$^-$ region and one p$^-$ region;

growing a high quality oxide layer on said n$^-$ and p$^-$ regions;

forming a gate for a DMOS transistor over the channel regions of said high quality oxide layer of at least a first pair of said selected pair of n$^-$ and p$^-$ regions, said gate extending over said local oxidized regions;

forming a field plate for a bipolar transistor over the base region of said n$^-$ and p$^-$ regions of at least a second pair of said n$^-$ and p$^-$ regions, said field plate extending over said local oxidized regions;

forming a gate for a MOS transistor on said high quality thin oxide layer on said n$^-$ and p$^-$ regions of at least a third pair of said n$^-$ and p$^-$ regions;

implanting a p-type dopant into said n$^-$ regions of said at least a first pair, said at least a second pair and said at least a third pair of n$^-$ regions adjacent to one side of said gates and said field plates to form p body areas in said n$^-$ region;

implanting an n-type dopant into said p$^-$ regions of said at least a first pair, said at least a second pair and said at least a third pair adjacent to said gate for said DMOS transistor to said gate of said MOS transistor, and said field plate of said bipolar transistor to form n body areas in said p$^-$ region;

implanting an n-type dopant into selected areas of said p body areas, said n body areas, and said n$^-$ regions to form selected n+ areas;

implanting a p-type dopant into selected areas of said p body areas, said n body areas and said p$^-$ regions to form selected p+ areas;

growing a low temperature oxide layer on said substrate covering said gates and field plates, said n$^-$ and p$^-$ regions and said n+ and p+ areas;

etching windows through said low temperature oxide layer exposing predetermined regions of said n+ and p+ areas and selected areas of said gates and field plates; and depositing a first metal in said predetermined regions exposed by said windows to form electrical contacts to said n+ and p+ areas, said gates and said field plates completing the fabrication of the complementary n and p DMOS transistors, complementary n and p bipolar transistors and complementary n and p MOS transistors.

2. The method of claim 1 wherein said step of implanting an n-type dopant and a p-type dopant comprises the steps of:

implanting said n-type dopant into said silicon layer using a first mask defining said n$^-$ regions; and implanting said p-type dopant into said silicon layer using a second mask defining said p$^-$ regions.

3. The method of claim 2 wherein said step of etching said silicon layer comprises the step of etching trenches through said silicon layer using a third mask isolating said plurality of n$^-$ regions and said plurality of p$^-$ regions from each other, said trenches having opposing side walls.

4. The method of claim 3 wherein said step of oxidizing the surfaces of said n$^-$ and p$^-$ regions further oxidizes said side walls of said trenches.

5. The method of claim 3 further comprising the steps of:

depositing a layer of polysilicon on a top surface of said substrate, said polysilicon layer having a thickness sufficient to fill said trenches; and blanket-etching said polysilicon layer to planarize said top surface leaving said trenches filled with polysilicon.

6. The method of claim 1 wherein said steps of forming a gate for a DMOS transistor, forming a field plate for a bipolar transistor and forming a gate for a MOS transistor comprises the steps of:

depositing a layer of polysilicon covering said substrate; and etching said polysilicon layer using a fifth mask to form polysilicon gates for said complementary DMOS transistors to form polysilicon field plates for said complementary bipolar transistors and to form gates for said complementary MOS transistors.

7. The method of claim 1 prior to said step of depositing a first metal further comprises the steps of:

depositing a layer of a second metal onto said exposed regions n+ and p+ areas and said selected areas of said gates and field plates through said windows; and heating said substrate to form low resistance silicized contact areas on said n+ and p+ areas and said selected areas of said gates and field plates exposed by said windows.

8. A method for making complementary transistors on a silicon-on-insulator substrate comprising the steps of:

forming a plurality of isolated n$^-$ and p$^-$ regions in the silicon layer of the silicon-on-insulator substrate;

oxidizing the surface of said isolated n$^-$ and p$^-$ regions to form a first oxide layer;

growing local oxide regions on preselected ones of said plurality of said n$^-$ and p$^-$ regions;

growing a high quality thin oxide layer on said n$^-$ and p$^-$ regions;

forming a gate for a DMOS transistor on each of at least a first two of said local oxide regions and forming a field plate for a bipolar transistor on each of a second at least two of said local oxide regions, one of said at least a first two and one of said at least a second two of said local oxide regions being formed on a respective one of said isolated n$^-$ regions and the other of said at least a first two and said at least a second two local oxide regions being formed on a respective one of said isolated p⁻ regions;

implanting a p-type dopant into said n⁻ regions adjacent to said gate and said field plate, respectively, to form p body areas;

implanting an n-type dopant into said p⁻ region, respectively, adjacent to said gate and said field plate to form an n body areas;

implanting an n-type dopant in selected areas of said p body and n body areas and said p⁻ regions to form n+ areas;

implanting a p-type dopant in selected areas of said p body and n body areas and said n⁻ regions to form p+ areas;

depositing a low temperature oxide layer on the substrate covering said gate, said field plate, said n⁻ and p⁻ regions and said n+ and p+ areas;

etching windows in said low temperature oxide layer exposing said n+ and p+ areas and selected areas of said n⁻ and p⁻ regions; and depositing a first metal on said n+ and p+ areas and said selected areas of said n⁻ and p⁻ regions through said windows to form electrical contacts to said n+ and p+ areas and said selected areas of said n⁻ and p⁻ regions completing the fabrication of complementary n and p DMOS transistors and complementary bipolar transistors.

9. The method of claim 8 wherein said step of forming a plurality of n⁻ and p⁻ regions comprises the steps of:

implanting an n-type dopant into first selected areas of the silicon layer to form a plurality of n⁻ regions using a first mask;

implanting a p-type dopant into second selected areas of the silicon layer to form a plurality of p⁻ regions using a second mask; and etching through the silicon layer using a third mask to form trenches around said p⁻ and said n⁻ regions, said trenches isolating said n⁻ and p⁻ regions from each other to form said isolated n⁻ and p⁻ regions, said trenches having side walls on opposing sides thereof.

10. The method of claim 9 further comprising, after said step of etching to form trenches, the steps of:

growing a first layer of oxide on said isolated n⁻ and p⁻ regions and said side walls of said trenches;

depositing a first layer of polysilicon on said substrate, said polysilicon layer having a thickness selected to fill said trenches; and blanket-etching said first layer of polysilicon to planarize said polysilicon filling said trenches leaving said first layer of oxide on said isolated n⁻ and p⁻ regions.

11. The method of claim 10 wherein said step of forming a gate for a DMOS transistor further comprising the steps of:

forming a gate for an MOS transistor on said first oxide layer on at least a third pair of said n⁻ and p⁻ regions; and wherein:

said steps of implanting an n-type dopant into said p⁻ region and a p-type dopant into said n⁻ regions implants said n-type dopant into said p⁻ region adjacent to said gate for said MOS transistor and implants said p-type dopant into said n⁻ region adjacent to said gate for said MOS transistor to form n body and p body areas adjacent to said gates of said MOS transistor;

said steps of implanting n-type and p-type dopants to form n+ and p+ areas respectively implants n-type and p-type dopants in said n body area and p body area of said MOS transistors and an n+ area in said p⁻ region and a p+ area in said n⁻ region;

said step of depositing a low temperature oxide layer is further deposited over said n⁻ region and said p⁻ region for said MOS transistors and said step of etching windows etches windows in said low temperature oxide layer exposing said n+ and p+ areas of said n body area, said p body area, said n⁻ region and said p⁻ region for said MOS transistors; and said step of depositing a first conductive material on said n+ and p+ areas deposits said first conductive material on said n+ and p+ areas for said MOS transistor completing the fabrication of complementary DMOS, complementary bipolar and complementary MOS transistor on the SOI substrate.

12. The method of claim 8 wherein said steps of forming a gate and a field plate comprises the steps of:

depositing a second layer of polysilicon on said substrate; and etching said second layer of polysilicon using a fifth mask to form said gates and said field plates.

13. The method of claim 8 wherein said method further includes the step of forming a silicide layer on said n+ and p+ areas, said gates and said field plates to form low resistance electrical contact areas prior to the step of depositing a metal to form electrical contacts.

14. A method for fabricating complementary transistors on a silicon layer of a silicon-on-insulator substrate comprising the steps of:

implanting n-type and p-type dopants into selected regions of the silicon layer to form n⁻ and p⁻ regions;

etching the silicon layer to form trenches isolating said n⁻ and p⁻ regions from each other;

growing a first oxide layer on said n⁻ and p⁻ regions;

growing local oxide regions on at least a first pair of said n⁻ and p⁻ regions, said first pair comprising at least one n⁻ region and one isolated p⁻ region;

growing a high quality thin oxide layer on said n⁻ and p⁻ regions;

forming a gate for a DMOS transistor on said high quality thin oxide region of said first pair of n⁻ and p⁻ regions, said gate extending onto said local oxide region;

forming a gate for a MOS transistor on said high quality thin oxide layer on a second pair of n⁻ and p⁻ regions, said second pair comprising one isolated n⁻ region and one isolated p⁻ region;

implanting a p-type dopant into said n⁻ regions to form p body areas adjacent to said gates;

implanting an n-type dopant into said p⁻ regions to form n body areas adjacent to said gates;

implanting an n-type dopant into said p body and n body areas and said p⁻ regions to form n+ areas;

implanting a p-type dopant into said n body and p body areas and said n⁻ regions to form p+ areas;

depositing a low temperature oxide layer on the substrate covering said gates and said n+ and p+ areas;

etching windows in said low temperature oxide layer to expose said n+ and p+ areas and selected areas of said gates;

depositing a conductive material on said n+ and p+ areas and said selected areas of said gates to form electrical contacts to said DMOS and MOS transistors.

* * * * *